(12) United States Patent
Khaselev et al.

(10) Patent No.: US 8,597,548 B2
(45) Date of Patent: Dec. 3, 2013

(54) SOLVENT SYSTEMS FOR METALS AND INKS

(75) Inventors: Oscar Khaselev, Monmouth Junction, NJ (US); Nitin Desai, Princeton Junction, NJ (US); Michael T. Marczi, Chester, NJ (US); Bawa Singh, Voorhees, NJ (US)

(73) Assignee: Alpha Metals, Inc., South Plainfield, NJ (US)

(*) Notice: Subject to any disclaimer, the term of this patent is extended or adjusted under 35 U.S.C. 154(b) by 350 days.

(21) Appl. No.: 11/857,818

(22) Filed: Sep. 19, 2007

(65) Prior Publication Data

US 2008/0145560 A1 Jun. 19, 2008

Related U.S. Application Data

(60) Provisional application No. 60/826,601, filed on Sep. 22, 2006, provisional application No. 60/866,721, filed on Nov. 21, 2006.

(51) Int. Cl.
*H01B 1/02* (2006.01)
*B05D 1/06* (2006.01)
*G01D 11/00* (2006.01)

(52) U.S. Cl.
USPC .................. 252/514; 427/466; 347/100

(58) Field of Classification Search
USPC ......... 252/500–521.6, 514; 427/466; 347/100
See application file for complete search history.

(56) References Cited

U.S. PATENT DOCUMENTS

| 6,103,868 | A | 8/2000 | Heath | |
|---|---|---|---|---|
| 6,921,626 | B2* | 7/2005 | Ray et al. | 430/311 |
| 2003/0110978 | A1* | 6/2003 | Abe et al. | 106/31.13 |
| 2005/0129843 | A1 | 6/2005 | Wu | |
| 2006/0073667 | A1* | 4/2006 | Li et al. | 438/311 |
| 2006/0189113 | A1 | 8/2006 | Vanheusden et al. | |
| 2008/0032047 | A1* | 2/2008 | Parashar et al. | 427/372.2 |
| 2009/0029148 | A1* | 1/2009 | Hashimoto et al. | 428/323 |

FOREIGN PATENT DOCUMENTS

| JP | 2004-143571 A | 5/2004 |
|---|---|---|
| JP | 2004-256757 A | 9/2004 |
| JP | 2005-089318 A | 4/2005 |
| JP | 2005093380 A | 4/2005 |
| WO | 03/032084 A2 | 4/2003 |
| WO | WO 2007034922 A1 * | 3/2007 |

OTHER PUBLICATIONS

"Inkjet printer" entry, Wikipedia, http://en.wikipedia.org/wiki/Inkjet_printer.*
Lee et al. "Direct Synthesis and Inkjetting of Silver Nanocrystals Toward Printed Electronics." Nanotechnology, 17 (2006), 2424-2428.

* cited by examiner

*Primary Examiner* — Mark Kopec
*Assistant Examiner* — Jaison Thomas
(74) *Attorney, Agent, or Firm* — Lando & Anastasi, LLP

(57) ABSTRACT

Solvent systems and dispersions including such solvent systems for use in compositions including metals and inks are provided. In certain examples, the solvent systems may be used with capped metal particles to provide a dispersion that may be used to print conductive lines.

26 Claims, 4 Drawing Sheets

FIG. 4A
FIG. 4B
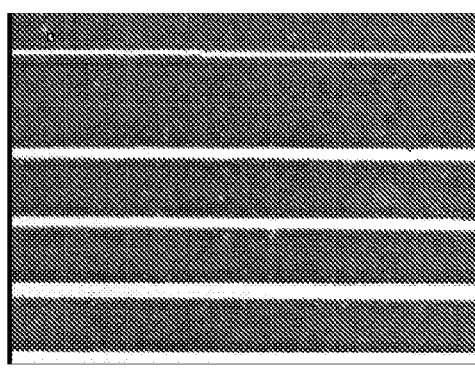
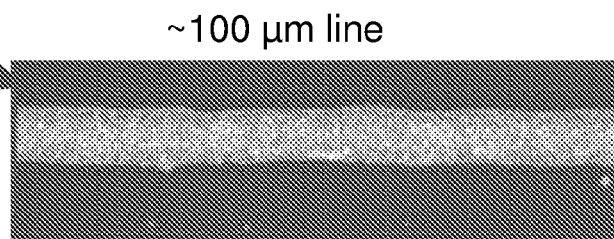
~100 μm line

SOLVENT SYSTEMS FOR METALS AND INKS

PRIORITY APPLICATIONS

This application claims priority to U.S. Provisional Application No. 60/826,601 filed on Sep. 22, 2006 and to U.S. Provisional Application No. 60/866,721 filed on Nov. 21, 2006, the entire disclosure of each of which is hereby incorporated herein by reference for all purposes.

FIELD OF THE TECHNOLOGY

Embodiments of the technology disclosed herein relate generally to solvent systems for use in metal particle dispersions such as, for example, nanoparticle dispersions.

BACKGROUND

The electronics industry is moving towards devices with a smaller footprint. As electrical devices become smaller, there remains a need for better methods and materials to produce such smaller devices.

SUMMARY

In accordance with a first aspect, a solvent system for use with inks is provided. In certain examples, the solvent system includes at least two components. In some examples, the first component of the solvent system is a substantially non-polar molecule. In certain examples, the second component of the solvent system is a molecule that is more polar than the first component. In certain examples, the first component of the solvent system has a dielectric constant at 20° C. that is less than about 4. In other examples, the second component of the solvent system has a dielectric constant at 20° C. that is greater than about 4.

In accordance with another aspect, an ink comprising particles and having a viscosity of about 10-12 cPs at a printing temperature is disclosed. In certain examples, a viscosity of about 10-12 cPs is provided by suspending or dissolving the particles in one or more of the solvent systems disclosed herein. In some examples, the particles may include silver particles, such as the silver nanoparticles described herein. In certain examples, the printing temperature may vary from about 28° C. to about 70° C.

In accordance with an additional aspect, an ink comprising particles and having a surface tension of 30-32 dynes/cm at a printing temperature is provided. In certain examples, a surface tension of about 30-32 dynes/cm may be provided by suspending or dissolving the particles in one or more of the solvent systems disclosed herein. In some examples, the particles may include silver particles, such as the silver nanoparticles described herein. In certain examples, the printing temperature may vary from about 28° C. to about 70° C.

In accordance with another aspect, an ink comprising particles that are finely dispersed is disclosed. Finely dispersed refers to the conditions where the particles have been processed to avoid or reduce agglomeration. For example, the primary size of the metal particles may be about 10-20 nm in diameter. These particles may agglomerate to some degree under certain conditions. Before printing, the metal particles may be filtered through a membrane or filter, e.g., a 0.2 micron PTFE filter from Whatman, to provide finely dispersed particles. In certain examples, inks that are finely dispersed may be provided by suspending or dissolving metal particles in one or more of the solvent systems disclosed herein. In some examples, the particles may include silver particles, such as the silver nanoparticles described herein.

In accordance with an additional aspect, an ink comprising particles and a carrier and that is stable during printing and storage is disclosed. In certain examples, the carrier of the ink may include one or more of the solvent systems disclosed herein to provide such stability. In some examples, the particles may include silver particles, such as the silver nanoparticles described herein. In certain examples, the inks are stable when printed under conditions similar to those used with inkjet printers.

In accordance with another aspect, a device comprising a substrate and one or more electrical conductors producing using at least one of the inks disclosed herein is provided. In certain examples, the electrical conductor may be produced using inkjet printing along with one or more of the inks disclosed herein.

In accordance with an additional aspect, an ink comprising capped metal particles and designed for use in an inkjet printer is disclosed.

In accordance with another aspect, an ink cartridge comprising an ink reservoir and capped metal particles disposed in a solvent system in the ink reservoir is provided.

In accordance with an additional aspect, a printing system comprising a print head, an ink reservoir fluidically coupled to the print head, the ink reservoir comprising capped metal particles disposed in a solvent system, and means for moving the print head.

Additional aspects and features of the technology, and uses of such additional aspects and features, are disclosed herein.

BRIEF DESCRIPTION OF THE FIGURES

Certain examples are described in detail below with reference to the accompanying figures in which:

FIGS. 4A and 4B are photographs of individual conductive lines of various widths, in accordance with certain examples.

Figure 1:
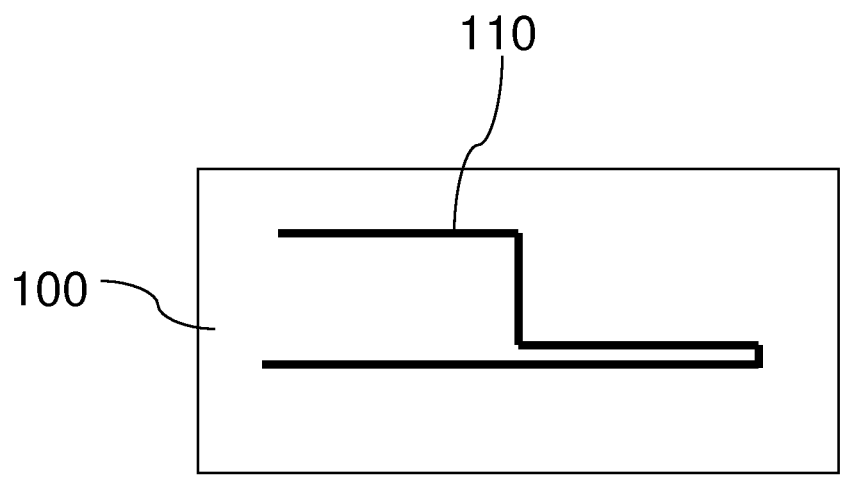
FIG. 1 is an example of a printed wiring board including a conductive pattern, in accordance with certain examples.

Certain features shown in the figures may have been enlarged, distorted or otherwise altered or shown in a non-conventional manner to facilitate a better understanding of the technology disclosed herein.

DETAILED DESCRIPTION

Certain illustrative embodiments and examples are described in more detail below to illustrate further, some of the many configurations and applications of the technology disclosed herein.

As used herein, the term "printing temperature" refers to the temperature at which the ink or material is disposed onto a substrate. The exact printing temperature used may vary depending on many factors including, but not limited to, the composition of the ink or material to be disposed, the properties of the substrate receiving the ink and the like. In examples where a silver nanoink is inkjet printed onto a substrate, the printing temperature is about 28° C. to about 70° C.

The electronics industry has increasingly moved toward the production of low cost printable electronics formed on various substrates. Traditional printing techniques such as screen printing, gravure and offset are currently used to create printed electronic circuits on substrates. A drawback of these techniques is the relatively low resolution of printed structures.

Ink jet technology may be used as a method of printing electronic circuits using inks of various formulations and materials. For printing conductive lines the material of choice may be silver or copper powder mixed in epoxy or other polymeric matrix. After printing such inks are subject to curing by UV or temperature to ensure conductivity and adhesion to the substrate. However such lines have only limited electrical conductivity of about 200-300 μΩcm. Alternatively the "firing silver ink" provides low resistivity of about 3-4 μΩcm but requires sintering at 600-900° C. that may limit application of this ink to high temperature stable substrates such as silicon or ceramics.

Nanotechnology provides new methods for production of conductive structures. It was demonstrated in U.S. application Ser. No. 11/462,089 that metallic particles can be sintered at temperatures as low as 150-200° C. and create highly conductive films and structures. The entire disclosure of U.S. application Ser. No. 11/462,089 is hereby incorporated herein by reference for all purposes. Nanosilver is a material of the most interest and was widely investigated for making conductive lines. To make silver nanopowder sinterable the particles are desirably capped with an organic coating, such as long chain amines, thiols or carboxylic acids. A typical printing practice includes dispersion of the nanopowder in organic solvents such as toluene and then spin-coating or dispensing the dispersion on the substrate. The substrate may then be heated to 150-250° C. for a period of time to sinter the nanopowder which forms conductive lines of different conductivity depends on particle chemistry, size and sintering conditions.

Previous attempts to apply nanomaterials by ink jet technology have very limited success. In certain instances, the process may not be reliable and may be accompanied with frequent clogging of nozzles and low resolution of printed structures and relatively low conductivity of lines. A possible reason for difficulties is that for successful ink jet printing the ink needs to posses certain physical properties such as viscosity and surface tension which need to be adjusted to very specific values, e.g., 10-12 cPs for viscosity and 30-32 dynes/cm for surface tension. In traditional ink technology, these properties may be achieved by the addition of rheology modifiers to the ink solvent system. Unfortunately such modifiers are usually very high boiling materials and when introduced into the system along with nanoparticles may leave significant residues that may reduce conductivity of lines. On the other hand, nanodispersions without modifiers have low viscosity and surface tension that resulted in poor ink jet printing.

In accordance with certain examples, an ink comprising particles suspended in a solvent system is disclosed. In certain examples, the ink is selected for its ability to be used in inkjet printing application, as discussed in more detail below.

Certain embodiments of the inks disclosed herein include particles which may take the form of nanoparticles. As used herein, the term "nanoparticle" refers to a particle having a particle diameter of at least about 5 nanometers to about 500 nanometers, more particularly at least about 5 nanometers to about 100 nanometers, e.g., about 5 nanometers to about 50 nanometers.

In accordance with certain examples, the ink may include silver particles dispersed in a suitable solvent system. Silver particles are well known materials and available from different commercial sources. Normally, the size of particles ranges from 5 to 70 nm. The known advantage of particles compared to regular silver powder is their ability to be heated or sintered in solid structures at temperatures much lower then melting temperatures. The silver particles can be heated, for example, at temperatures as low as 200° C. The heating process is a diffusion process in which silver migrates from particle to particle forming connecting bridges between particles. The structures formed by heating of currently available silver particles are conductive, but their conductivity is still much lower then that of bulk silver. The reported conductivity is in the range of $1\text{-}2*10^4$ S/cm compared to $62*10^4$ S/cm for the bulk silver. There remains a need for silver films whose conductivity is much closer to that of bulk silver.

In accordance with certain examples, particles suitable for use in the inks disclosed herein may be produced by mixing at least one metal or metal salt and a capping agent in a single phase solution or in a multi-phase solution. In certain examples, the metal or metal salt may be selected from conductive metals or conductive metal salts including, for example, transition metals or transition metal salts of gold, silver, copper, nickel, platinum, palladium, iron, and alloys thereof. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Additional anions are disclosed below in reference to the particular illustrative metal salts disclosed.

In certain examples, the use of a single phase solution to produce the particles permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, a silver salt may be used to provide particle suitable for use in the inks disclosed herein. In instances where a silver salt is used, the silver salt may be one or more of silver chloride, silver bromide, silver iodide, silver thiocyanate, silver sulfate, silver chromate, silver phosphate, silver oxalate, silver carbonate, silver sulfite, silver hydroxide, silver nitrate, silver chlorate, silver acetate, silver nitrite, silver acetylacetonate, silver lactate, silver (II) fluoride, silver (I) hydrogenfluoride, silver (I) permanganate, silver metavanadate, silver trifluoroacetate, potassium dicyanoargentate, silver benzoate, silver arsenate, silver bromate, silver cyclohexanebutyrate, silver fluorosulfate, silver hexafluoroantimonate (V), silver hexafluoroarsenate(V), silver hexafluorophosphate, silver (I) fluoride, silver (I) oxide, silver (I) perrhenate, silver (I) selenide, silver (I) telluride, silver iodate, silver orthophosphate, silver sulfide, and silver tungstate. Additional suitable silver salts will be readily selected by the person of ordinary skill in the art, given the benefit of this disclosure.

In accordance with certain examples, a gold salt may be used to provide particles suitable for use in the inks disclosed herein. In instances where a gold salt is used, the gold salt may be one or more of gold(III) chloride hydrate, hydrogen tetrachloroaurate(III) hydrate, chloro(dimethylsulfide)gold (I), gold (I) chloride, gold colloid, gold (I) cyanide, gold (I) iodide, gold (I) sulfide, gold (III) bromide hydrate, gold (III)

chloride, gold (III) chloride trihydrate, gold (III) hydroxide, gold (III) oxide hydrate, gold (III) sulfide, potassium dicyanoaurate (I), potassium gold (III) chloride, and sodium tetrachloroaurate(III) dehydrate. Additional suitable gold salts will be readily selected by the person of ordinary skill in the art, given the benefit of this disclosure.

In accordance with certain examples, a copper salt may be used to produce particles suitable for use in the inks disclosed herein. In instances where a copper salt is used, either the cuprous form (copper (I)) or the cupric form (copper (II)) may be used. Illustrative copper salts include, but are not limited to, copper (I) chloride, copper (II) chloride, copper (I) bromide, copper (II) bromide, copper (I) iodide, copper (II) iodide, copper mercuric iodide, copper (I) tetraiodomercurate (II), cuprous thiocyanate, copper (II) sulfate, copper(II) acetylacetonate, ammonium tetrachlorocuprate(II) dihydrate, copper aluminum oxide, copper chromite, ethylenediaminetetraacetic acid diammonium copper salt solution, ethylenediaminetetraacetic acid copper(II) disodium salt, copper (I) acetate, copper (I) cyanide, copper (I) oxide, copper (I) selenide, copper (I) sulfide, copper (I) telluride, copper (I) thiophenolate, copper (II) acetate, copper(II) acetate hydrate copper (II) acetate monohydrate, copper (II) carbonate, copper (II) hydroxide, copper (II) molybdate, copper (II) niobate, copper (II) nitrate, copper (II) selenide, copper (II) selenite dehydrate, copper (II) sulfate, copper (II) sulfide, copper (II) telluride, tris(ethylenediamine)copper (II) sulfate, and combinations thereof. Additional suitable copper salts will be readily selected by the person of ordinary skill in the art, given the benefit of this disclosure.

In accordance with certain examples, an aluminum salt may be used to provide particles suitable for use in the inks disclosed herein. In instances where an aluminum salt is used, the aluminum salt may be, for example, one or more of aluminum acetate, aluminum phosphate monobasic, aluminum sulfate, aluminum ethoxide, aluminum potassium sulfate, aluminum silicate, aluminum acetate, aluminum arsenide, aluminum bromide, aluminum chloride, aluminum chloride hydrate, aluminum fluoride, aluminum fluoride hydrate, aluminum fluoride trihydrate, aluminum hydroxide, aluminum iodide, aluminum sulfide, aluminum nitrate, aluminum thiocyanate, aluminum chlorate, and aluminum nitrite. Additional suitable aluminum salts will be readily selected by the person of ordinary skill in the art, given the benefit of this disclosure.

In accordance with certain examples, a platinum salt may be used to produce particles suitable for use in the inks provided herein. In instances where a platinum salt is used, the platinum salt may be, for example, one or more of platinum (II) acetylacetonate, platinum (IV) chloride, platinum(IV) oxide, platinum (II) bromide, platinum (II) chloride, platinum (II) cyanide, platinum (II) hexafluoroacetylacetonate, platinum (II) iodide, platinum (IV) sulfide, and platinum nitrate. Additional suitable platinum salts will be readily selected by the person of ordinary skill in the art, given the benefit of this disclosure.

In accordance with certain examples, a palladium salt may be used to produce particles suitable for use in the inks disclosed herein. In instances where a palladium salt is used, the palladium salt may be, for example, one or more of palladium (II) acetylacetonate, palladium(II) trifluoroacetate, palladium hydroxide, palladium (II) acetate, palladium(II) bromide, palladium (II) chloride, palladium(II) cyanide, palladium(II) hexafluoroacetonate, palladium(II) iodide, palladium (II) nitrate dehydrate, palladium(II) nitrate hydrate, palladium(II) oxide, palladium (II) propionate, palladium (II) sulfate, palladium (II) sulfide, and palladium on alumina. Additional suitable palladium salts will be readily selected by the person of ordinary skill in the art, given the benefit of this disclosure.

In accordance with certain examples, a cobalt salt may be used to produce particles suitable for use in the inks disclosed herein. In instances where a cobalt salt is used, the cobalt salt may be, for example, one or more of ammonium cobalt(II) sulfate hexahydrate, cobalt chloride, cobalt (II) acetate, cobalt (II) acetate tetrahydrate, cobalt (II) acetylacetonate, cobalt (II) acetylacetonate hydrate, cobalt (II) bromide, cobalt (II) chloride, cobalt (II) chloride hexahydrate, cobalt (II) chloride hydrate, cobalt (II) cyanide dehydrate, cobalt (II) iodide, cobalt (II) thiocyanate, cobalt (II) nitrate hexahydrate, and cobalt (III) acetylacetonate. Additional suitable cobalt salts will be readily selected by the person of ordinary skill in the art, given the benefit of this disclosure.

In accordance with certain examples, a chromium salt may be used to produce particles suitable for use in the inks disclosed herein. In instances where a chromium salt is used, the chromium salt may be, for example, one or more of chromium (III) acetylacetonate, chromium (II) acetate, chromium (II) chloride, chromium(II) fluoride, chromium (II) selenide, chromium (III) acetate hydroxide, chromium (III) bromide hexahydrate, chromium (III) chloride, chromium (III) chloride hexahydrate, chromium (III) chloride hydrate, chromium (III) fluoride, chromium (III) sulfate hydrate, chromium (III) telluride, chromium silicide, and chromium nitrate. Additional suitable chromium salts will be readily selected by the person of ordinary skill in the art, given the benefit of this disclosure.

In accordance with certain examples, an indium salt may be used to produce particles suitable for use in the inks disclosed herein. In instances where an indium salt is used, the indium salt may be, for example, one or more of indium (III) acetylacetonate, indium antimonide, indium (I) bromide, indium (I) chloride, indium (I) iodide, indium (II) chloride, indium (III) acetate, indium (III) acetate hydrate, indium (III) bromide, indium (III) chloride, indium (III) chloride hydrate, indium (III) chloride tetrahydrate, indium (III) fluoride, indium (III) fluoride trihydrate, indium (III) hydroxide, indium (III) iodide, indium (III) nitrate hydrate, indium (III) nitrate hydrate, indium (III) nitrate pentahydrate, indium (III) nitride, indium (III) oxide, indium (III) perchlorate hydrate, indium (III) selenide, indium (III) sulfate, indium (III) sulfate hydrate, and indium (III) telluride. Additional suitable indium salts will be readily selected by the person of ordinary skill in the art, given the benefit of this disclosure.

In accordance with certain examples, a nickel salt may be used to produce particles suitable for use in the inks disclosed herein. In instances where a nickel salt is used, the nickel salt may be, for example, one or more of nickel(II) acetylacetonate, nickel (II) acetate tetrahydrate, nickel (II) carbonate hydroxide tetrahydrate, nickel (II) octanoate hydrate, nickel sulfide, nickel carbonate, nickel (II) bromide, nickel (II) bromide hydrate, nickel (II) bromide trihydrate, nickel (II) carbonate basic hydrate, nickel (II) chloride, nickel (II) chloride hexahydrate, nickel (II) chloride hydrate, Nickel(II) cyclohexanebutyrate, nickel (II) fluoride, nickel (II) fluoride tetrahydrate, nickel (II) hexafluoroacetylacetonate hydrate, nickel (II) hydroxide, nickel (II) iodide, nickel (II) molybdate, nickel (II) nitrate hexahydrate, nickel (II) oxalate dehydrate, nickel (II) oxide, nickel (II) perchlorate hexahydrate, nickel (II) peroxide hydrate, nickel (II) phosphide, nickel (II) stearate, nickel (II) sulfate hexahydrate, and nickel on silica. Additional suitable nickel salts will be readily selected by the person of ordinary skill in the art, given the benefit of this disclosure.

In accordance with certain examples, an iridium salt may be used to produce particles suitable for use in the inks disclosed herein. In instances where an iridium salt is used, the iridium salt may be, for example, one or more of iridium (III) acetylacetonate, iridium (III) bromide hydrate, iridium(III) chloride, iridium (III) chloride hydrate, iridium (III) chloride hydrochloride hydrate, iridium (IV) chloride hydrate, iridium (IV) oxide, iridium (IV) oxide hydrate and iridium nitrate. Additional suitable iridium salts will be readily selected by the person of ordinary skill in the art, given the benefit of this disclosure.

In accordance with certain examples, a rhodium salt may be used to produce particles suitable for use in the inks disclosed herein. In instances where a rhodium salt is used, the rhodium salt may be, for example, one or more of rhodium (III) acetylacetonate, rhodium (II) acetate dimmer, rhodium (II) acetate dimer dehydrate, rhodium (II) heptafluorobutyrate, rhodium (II) hexanoate, Rhodium(II) octanoate dimer, rhodium (II) trifluoroacetate dimer, rhodium (II) trimethylacetate dimer, rhodium (III) bromide hydrate, rhodium (III) chloride, rhodium (III) chloride hydrate, rhodium (III) iodide hydrate, rhodium (III) nitrate hydrate, rhodium (III) oxide, rhodium (III) oxide hydrate, rhodium (III) phosphate solution, sodium hexachlororhodate(III) dodecahydrate, rhodium (III) sulfate solution, rhodium (IV) oxide, rhodium on activated alumina, rhodium on activated charcoal, tris(ethylenediamine)rhodium(III) chloride, and tris(ethylenediamine)-rhodium(III) nitrate. Additional suitable rhodium salts will be readily selected by the person of ordinary skill in the art, given the benefit of this disclosure.

In accordance with certain examples, an osmium salt may be used to produce particles suitable for use in the inks disclosed herein. In instances where an osmium salt is used, the osmium salt may be, for example, one or more of osmium (III) chloride hydrate, osmium tetrachloride, osmium tetroxide, osmium trichloride and tetra-osmium-nitrate. Additional suitable osmium salts will be readily selected by the person of ordinary skill in the art, given the benefit of this disclosure.

In accordance with certain examples, an iron salt may be used to produce particles suitable for use in the inks disclosed herein. In instances where an iron salt is used, the iron salt may be, for example, one or more of iron (III) acetylacetonate, iron (II) acetylacetonate, iron ascorbate, ammonium iron (II) sulfate hexahydrate, iron (III) citrate tribasic monohydrate, iron (II) gluconate dehydrate, iron (III) pyrophosphate, iron (II) phthalocyanine, iron (III) phthalocyanine chloride, ammonium iron (III) citrate, ammonium iron (II) sulfate, ammonium iron (III) sulfate, ammonium iron (III) sulfate dodecahydrate, iron (III) chloride, iron (III) bromide, iron (III) chloride hexahydrate, ferric citrate, iron (III) fluoride, iron (III) nitrate nonahydrate, iron (III) oxide, iron (III) phosphate, iron (III) sulfate hydrate, iron (II) bromide, iron (II) chloride, iron (III) phosphate hydrate, iron (III) phosphate tetrahydrate, iron (II) chloride hydrate, iron (II) chloride tetrahydrate, iron (II) ethylenediammonium sulfate tetrahydrate, iron (II) fluoride, iron (II) gluconate hydrate, iron (II) iodide, iron (II) lactate hydrate, iron (II) oxalate dehydrate, ferrous sulfate heptahydrate, iron (II) sulfide, iron (II) acetate, iron (II) fluoride tetrahydrate, iron (II) iodide tetrahydrate, iron (II) molybdate, iron (II) oxide, iron (II) perchlorate hydrate, iron (II) titanate, and iron (III) ferrocyanide. Additional suitable iron salts will be readily selected by the person of ordinary skill in the art, given the benefit of this disclosure.

In accordance with certain examples, a ruthenium salt may be used to produce particles suitable for use in the inks disclosed herein. In instances where a ruthenium salt is used, the ruthenium salt may be, for example, one or more of ruthenium (III) acetylacetonate, ruthenium(IV) oxide, ammonium hexachlororuthenate (IV), ruthenium (III) chloride, ruthenium on activated charcoal, ruthenium on alumina, ruthenium on carbon, ruthenium(III) bromide, ruthenium(III) chloride hydrate, ruthenium(III) chloride trihydrate, ruthenium(III) iodide, ruthenium(III) nitrosyl chloride hydrate, ruthenium (III) nitrosyl nitrate solution, and ruthenium(IV) oxide hydrate. Additional suitable ruthenium salts will be readily selected by the person of ordinary skill in the art, given the benefit of this disclosure.

In accordance with certain examples, the metal used to provide the particles for use in the inks disclosed herein may be uncomplexed or may be complexed with one or more ligands. For example, the metal may be complexed with EDTA, ethylenediamine, oxalate, 2,2'-bypyridine, cyclopentadiene, diethylenetriamine, 2,4,6,-trimethylphenyl, 1, 10-phenanthroline, triethylenetetramine or other ligands.

In accordance with certain examples, the inks disclosed herein may include two or more different metal particles suspended in a solvent system. For example, an illustrative ink may include both capped silver particles and capped gold particles each suspended in a suitable solvent system.

In certain examples, the metal or metal salt may be dissolved in one or more of the solvent systems to provide a clear, but not necessarily colorless, solution. For example, a suitable amount of metal or metal salt may be added to a solvent or a solvent system such that when the metal or metal salt goes into solution, the overall solution is clear. The overall solution may be colored or may be colorless. In certain examples, the combination of solvents provides a single phase. To achieve a single phase when using a solvent system, the amounts of each solvent may be adjusted such that a single phase results when the solvents are mixed. Should more than one phase be present upon mixing, the relative amounts of one or more of the solvents can be altered, e.g., increased or decreased, until a single phase is observed. Alternatively, a third solvent may be added to increase the miscibility of the first and second solvent.

In accordance with certain examples, the particles may also be produced by adding a capping agent to the metal salt dissolved in the solvent or solvent system. The capping agent may be effective to isolate the particle and limit the size of its growth. In certain examples, the capping agent is a high molecular weight capping agent, e.g., has a molecular weight of at least about 100 g/mole. Illustrative capping agents include, but are not limited to, organic amines having about 12 or more carbon atoms. In certain examples, the organic amine has at least about 16 carbon atoms, e.g., hexadecylamine. The organic moiety of the amine may be saturated or unsaturated and may optionally include other functionalities such as, for example, thiols, carboxylic acids, polymers, and amides. Another group of illustrative capping agents suitable for use in the methods disclosed herein are thiols having about 12 or more carbon atoms. In certain examples, the thiol has at least about 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like. Additional suitable capping agents will be readily selected by the person of ordinary skill in the art, given the benefit of this disclosure.

In certain examples where a capping agent is used, the capping agent may be dissolved in a suitable solvent or solvent system prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step.

In accordance with certain examples, the amount of capping agent added to the metal solution may vary depending on the desired properties of the resulting capped particles. In some examples, a suitable amount of capping agent is added to provide at least about 2% by weight capping agent in the capped particles. It will be recognized by the person of ordinary skill in the art, given the benefit of this disclosure, that it may be desirable to use more or less capping agent depending on the desired properties of the particles and/or the desired properties of the ink. For example, to increase the conductivity of particles disposed on a substrate, e.g., a printed wiring board, it may be desirable to adjust the amount of capping agent until the conductivity is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution may be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure.

In certain examples, the capping agent and the metal solution may be mixed using conventional techniques such as stirring, sonication, agitation, vibration, shaking or the like. In some examples, the capping agent is added to the metal solution while the metal solution is being stirred. In certain examples, the mixture of capping agent and metal solution may be stirred until a clear and/or colorless single phase solution results.

In accordance with certain examples, the particles may also be produced by adding a reducing agent to the metal-capping agent solution. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo) dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, e.g., $Ag^{+1}$ is converted to $Ag^0$.

In some examples, the reducing agent is dissolved in a solvent prior to addition to the metal-capping agent solution, whereas in other examples, the reducing agent is added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms. The person of ordinary skill in the art, given the benefit of this disclosure, will be able to select suitable solvent for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, e.g., about 30° C. to about 70° C., to speed the reduction process. When an elevated temperature is used, it is desirable to keep the temperature below the boiling point of the solvent or solvent system to reduce the likelihood of solvent evaporation, though in some examples, it may be desirable to reduce the overall volume of solvent.

In accordance with certain examples, the particles may also be produced by isolating the capped metal particles from the single phase solution. Isolation may occur, for example, by decanting, centrifugation, filtering, screening or addition of another liquid that the capped metal particles are insoluble in, e.g., extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, e.g., if the metal particles are produced in about five liters of solvent, then about 20 liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry.

In accordance with certain examples, the capped particles may be processed to remove the capping agent prior to use of the particles in an ink. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, e.g., the capping agent is present at less than 0.5% or 0.1% by weight.

In accordance with certain examples, the particles disclosed herein may be used to provide alloys. In certain examples, the capped particles disclosed herein may be used to provide a core-shell structure where the metal of the capped particle acts as a shell and another metal or metal alloy would act as a core. For example, a tin-copper alloy may be used as a core and silver particles (capped or uncapped) may be used as a shell to provide a type of SAC alloy, e.g., a nano SAC alloy. The exact process used to produce the alloy may vary, and in certain examples the alloy may be produced by dissolving ions of other metals, e.g., $Sn^{2+}$, $Cu^{2+}$, etc., in a dispersion of uncapped silver particles. The mixture may be subjected to reduction or other steps to produce an alloy having selected properties. In certain examples, the alloys may be placed in a suitable solvent system to provide an ink suitable for use in printing applications, e.g., inkjet printing applications.

In accordance with certain examples, the produced particles may be dissolved in a solvent system to provide selected properties, e.g., a suitable viscosity and surface tension, such that the particles may be printed onto a substrate using inkjet printing. In certain examples, a selected amount of particles are dispersed in a carrier to provide an ink. The exact amount of the particles selected may vary, and typically a suitable amount of particles (either capped or uncapped) are used to provide a dispersion including about 1 weight percent particles to about 60 weight percent particles, more particularly about 10 to about 40 weight percent particles, e.g., about 20 to about 25 weight percent particles. In embodiments where capped particles are used, the amount of the capped particles used may be altered to account for the additional weight added by the capping agent. In other examples, a sufficient amount of particles are used to provide a desired viscosity for the dispersion. For example, the viscosity of the dispersion may vary depending on the method or devices that the ink is to be used in. In examples where the ink is intended to be used in spin coating applications, a sufficient amount of particles may be selected to provide an ink viscosity of about 0.25 cPs to about 2 cPs, more particularly about 0.5 cPs to about 1.5 cPs, e.g., about 1 cPs. In examples where the ink is intended to be used in inkjet printing applications, a sufficient amount of particles may be selected to provide an ink viscosity of about 5 cPs to about 20 cPs, more particularly about 7 cPs to about 15 cPs, e.g., about 8-10 or 8-9 cPs. Similarly, where the ink is intended to be used in spin coating applications, a sufficient amount of particles may be selected to provide a surface tension of about 10 dynes/cm to about 35 dynes/cm, more particularly about 10 dynes/cm to about 20 dynes/cm, e.g., about 11 or 12 dynes/cm. It will be within the ability of the person of ordinary skill in the art, given the benefit of this disclosure, to select suitable solvent systems for imparting a desired property to an ink.

In accordance with certain examples, the carrier of the ink may be one or more of the solvent systems disclosed herein that can effectively disperse the particles in a selected manner, e.g., spin coating, inkjet printing, paste printing, etc. In certain examples, the carrier is a solvent system that includes a first component and a second component. In certain examples, the dielectric constant of the first component is less than that of the second component. In some examples, the first component is substantially non-polar with a dielectric constant at 20° C. that is less than about 4, more particularly less than about 3 or less than about 2. In certain examples, the second component has a dielectric constant that is preferably greater than about 2, more preferably greater than about 3 or about 4, provided that the dielectric constant of the second component is typically greater than that of the first component.

In certain examples, the first component may be selected to provide for dispersion of the particles. The second component may be selected to provide the ability to adjust the viscosity and surface tension of the dispersion. Viscosity modifiers that dissolve in one or both of the first component and the second component may also be used. For example, typical viscosity modifiers that may be used include, but are not limited to, ethylene glycol, propylene glycol or other polyols. Upon heating, glycols should easily decompose and evaporate without compromising conductivity of the final product.

In accordance with certain examples, the solvent system may include at least two solvents with one solvent being a substantially non-polar molecule, e.g., a hydrocarbon, and the second solvent being a solvent that is more polar than the first solvent. In examples where a hydrocarbon solvent is used, the hydrocarbon may be saturated or unsaturated, may be straight-chain, branched, cyclic or take other forms. The solvent may also be a substituted hydrocarbon, e.g., a halocarbon, or may be an ether (either linear or cyclic), a furan or other substituted hydrocarbon that is substantially non-polar. In some examples, the substantially non-polar molecule of the first solvent may be benzene, toluene, xylene, mesitylene or a cyclic hydrocarbon that may include, for example, one or more phenyl groups or saturated or unsaturated cyclic hydrocarbons. Additional solvents for use as the first component of the solvent systems disclosed herein will be readily selected by the person of ordinary skill in the art, given the benefit of this disclosure.

In accordance with certain examples, the solvent system may also include a second component that is more polar than the first component. The second component may be a solvent that includes at least one hydroxyl, amino, sulfo, nitrile, carboxy or other group. In some examples, the second solvent may be an alcohol such as, for example, methanol, ethanol, 2-methoxyethanol, propanol, isopropanol, butanol, 2-butanol, pentanol, hexanol, heptanol, octanol or terpeniol. In other examples, the second solvent may include a cyclic alcohol, such as cyclohexanol. In some examples, the second solvent may be a ketone such as, for example, acetone, methylethylketone, methylisoamylketone, or methylisobutylketone. In yet other examples, the second solvent may include an amine, amide group or carboxyl group optionally with one or more hydroxyl groups. In additional examples, the second solvent may include one or more —SH groups optionally with one or more hydroxyl groups. In certain examples, the second solvent may be dimethylformamide, dimethylsulfoxide, N,N-dimethylacetamide, ethyl acetate, N-methyl-2-pyrrolidone, pyridine, tetramethyl urea, acetic acid or water. Additional solvents for use as the second component of the solvent systems disclosed herein will be readily selected by the person of ordinary skill in the art, given the benefit of this disclosure.

In certain examples, the solvent system may include a mixture of the first component and the second component at any desired ratio. In certain examples, the amounts of the first component and the second component that are used are selected to provide an ink viscosity of about 10-12 cPs at a printing temperature. In other examples, the amounts of the first component and the second component that are used are selected to provide an ink having a surface tension of about 30-32 dynes/cm. Illustrative ratios of first component:second component are 4:1, 3:1, 2:1, 1:1, 1:2, 1:3, 1:4, and any ratio in between these ratios.

In accordance with certain examples, the solvent system may include three or more solvents. The exact ratio of the solvents used typically depends on the desired properties of the ink. In certain configurations, the ratios of the solvent are selected to provide an ink that is amenable to disposition using inkjet printing applications. In some examples, the ratios of the solvents are selected to provide a viscosity of about 10-12 cPs and/or a surface tension of about 30-32 dynes/cm. It will be within the ability of the person of ordinary skill in the art, given the benefit of this disclosure, to select suitable ratios of solvents for use in a solvent system that includes three or more solvents.

In accordance with certain embodiments, a solvent system may be selected such that an ink has a viscosity of about 10-12 cPs at a printing temperature. Inks that include a viscosity of about 10-12 cPs are especially useful in inkjet printing applications, such as those using piezoelectric Spectra and Xaar printheads. In some examples, the ink may include capped metal particles suspended in a suitable solvent system, e.g., a mixture of toluene, terpeniol and optionally xylene, to provide a viscosity of about 10-12 cPs. In certain examples, the ink may include capped silver particles, capped gold particles, or mixtures thereof.

In accordance with certain examples, a solvent system may be selected such that an ink has a surface tension of about 30-32 dynes/cm at a printing temperature. Inks that include a surface tension of about 30-32 dynes/cm are especially useful in inkjet printing applications, such as those using piezoelectric Spectra and Xaar printheads. In some examples, the ink may include capped metal particles suspended in a suitable solvent system, e.g., a mixture of toluene, terpeniol and optionally xylene, to provide a surface tension of about 30-32 dynes/cm. In certain examples, the ink may include capped silver particles, capped gold particles, or mixtures thereof.

In accordance with certain examples, the inks disclosed herein may have both a viscosity of about 10-12 cPs and a surface tension of about 30-32 dynes/cm. To achieve both properties, the relative amounts of the components in the solvent system may be adjusted. In addition, more or less capped metal particles may be used to achieve a desired viscosity and a desired surface tension for the ink. The person of ordinary skill in the art, given the benefit of this disclosure, will be able to adjust the amounts of capped metal particles and the components in a solvent system to achieve desired physical properties.

In accordance with certain examples, an ink that is finely dispersed and stable at a printing temperature is disclosed. In certain examples, stability may be assessed by determining whether or not the capped metal particles precipitate out of solution. It is desired that the capped metal particles be suspended in the solvent system to facilitate transfer of the capped metal particles to a substrate during printing. Substantial precipitation of the capped metal particles may result in poor transfer of material from the printer to the substrate. To increase stability of the ink, one or more dispersants may be added to the ink. Illustrative dispersants include, but are not limited to, Solsperse 17000, 20000 and 39000 from Noveox Corp. or Disperbyk 112, 117, 1250 from BYK.

In accordance with certain examples, the ink may be disposed, e.g., printed, on a substrate. Illustrative substrates include, but are not limited to, papers, glasses, silicone wafers, and polymer films. In certain examples, the ink may be disposed on the substrate in a suitable manner to produce a conductive pattern. For example and referring to FIG. 1, an ink may be disposed on a substantially planar surface of a substrate 100 such that a conductive pattern 110 remains after the carrier is removed. The exact thickness of the conductive pattern 110 may vary depending on the selected application of the film. In embodiments where the conductive pattern 110 is printed on a printed circuit board, the thickness of the conductive pattern 110 may vary, for example, from about 0.1 microns to about 5 microns and the width of the conductive pattern may vary from about 70 microns to about 700 microns. Additional widths and thicknesses for an intended use will be readily selected by the person of ordinary skill in the art, given the benefit of this disclosure.

Figure 2:
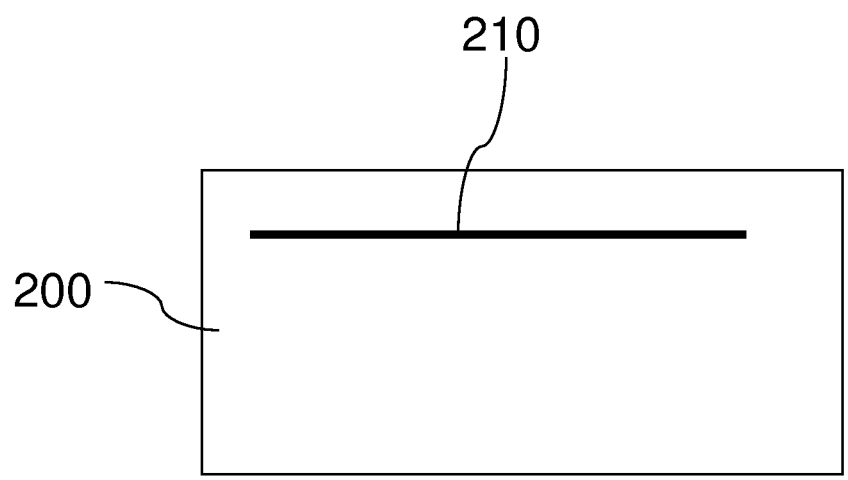
FIG. 2 is an example of a printed wiring board including a conductive line, in accordance with certain examples.
Figure 3A:
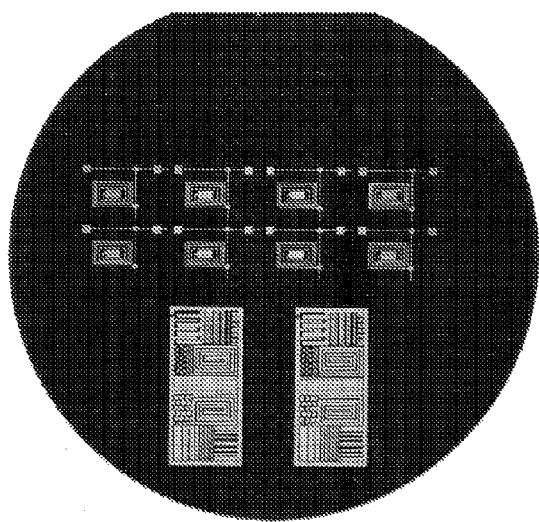
FIGS. 3A-3C are photographs of printed array of RFID antennas and blocks of interconnects and soldering pads, in accordance with certain examples.
Figure 3B:
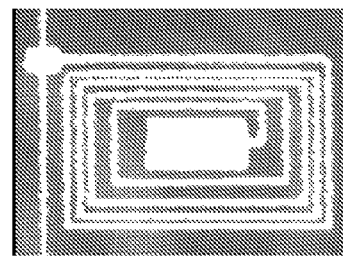
Figure 3C:
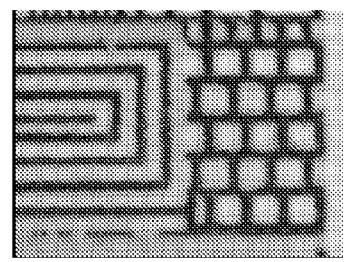

In accordance with certain examples, the ink may be processed prior to use. In certain embodiments, the ink may be mixed with dyes, other inks or other materials prior to use. In other embodiments, the ink may be heated, screened, filtered or the like prior to use. In certain examples, the particles may be heated, screened, filtered or the like prior to disposition in a solvent system to provide an ink. In certain embodiments employing the capped particles disclosed herein, heating permits the particles to coalesce and form highly conductive lines or patterns that may be used, for example, in circuits, printed wiring boards and the like. For example and referring to FIG. 2, a substrate 200 includes a conductive pattern 210 that may be operative to function as part of an electrical circuit, e.g., may function as an interconnect. The conductive pattern can be created using numerous different methods. In one embodiment, the conductive pattern 210 may be created by inkjet printing of the ink onto the substrate 200. In another embodiment, the conductive pattern 210 may be created by disposing a mask over the substrate 200 and inkjet printing on areas that are not covered by the mask. Without wishing to be bound by any scientific theory or this example, the use of a mask may provide lines that are more highly defined. In an additional embodiment, a conductive pattern 210 may be disposed on a substrate 200 and a portion of it may be etched away, or otherwise removed, to provide a desired pattern. Additional embodiments for disposing inks on a substrate to create a desired pattern will be readily selected by the person of ordinary skill in the art, given the benefit of this disclosure. Illustrative uses for articles produced using the inks disclosed herein include, but are not limited to, printed electrical circuits, radio frequency identification (RFID) antennas, solar cell wires, solar cell interconnect, battery electrodes, and reflective surfaces and mirrors.

In accordance with certain examples, the type and nature of the substrate depends, at least in part, on the desired device that is to be produced. For example, in application where a printed circuit board is produced, the substrate may be one or more cured or uncured prepregs. The substrates may be made from many different materials, including but not limited to, traditional silicon and also polymeric substrates such as for example, polyethylene, polypropylene, polyimide and polyester. These substrates are relatively inexpensive to make and provide good adhesion of electronic components. The substrate may include reinforcing fibers or whiskers, may include glasses, additives, foams, flame retardants and other materials to impart desired properties to the substrate.

In embodiments where an ink is subjected to heating, heating is typically performed using a hot-plate, oven (high temperature convection oven, reflow oven, IR oven, etc.), laser heating or other methods and devices that can increase the temperature of the particle dispersion or the ink. In certain examples, the ink may be heated to at least about 250° C. for 10-60 seconds, e.g., 250° C. for 30 seconds. In other examples, sequential heating may be performed such that the ink is heated at a first temperature for a selected time followed by heating at a second temperature for a selected time. For example, the ink may be heated at about 110-130° C. for 10-30 seconds, e.g., 120° C. for 20 seconds, followed by a second heating step at 250-300° C. for 10-60 seconds, e.g., 280° C. for 20 seconds. Subsequent to heating, the particles and inks may be subjected to other processing steps.

In accordance with certain examples, the inks disclosed herein may be used along with a suitable apparatus for disposal of the inks. While the exact method used to dispose the ink on a substrate is not critical, a non-impact printing device, such as, for example, an inkjet printer, may be used to print the ink onto a substrate. In embodiments where an inkjet printer is used, the inkjet printer includes an ink reservoir or cartridge that holds the ink. The ink cartridge is in fluid communication with a print head, which typically includes a series of nozzles that spray the ink onto the substrate. The inkjet printer may also include a suitable motor to move the print head to a desired position. One or more belts or chains may connect the motor to the print head. The inkjet printer may include stabilizer bars or supports to stabilize the print heat during the printing process. Illustrative inkjet printers suitable for use include, but are not limited to, those using or configured to use piezoelectric printheads such as, for example, those available from Spectra and Xaar. Other suitable inkjet printers will be readily selected by the person of ordinary skill in the art, given the benefit of this disclosure.

Several specific examples are disclosed below to facilitate a better understanding of the technology described herein. In all the examples disclosed below, unless otherwise noted, all formulations were ball milled for 48 hours and provided a stable dispersion of particles for weeks without visible precipitation.

EXAMPLE 1

A batch of silver particles was prepared by adding 108 grams of silver nitrate to 200 millimeters (mL) of ethylene glycol to provide a silver nitrate concentration of 3.2 moles/Liter. The entire 200 mL solution was added to 1500 mL of ethanol to which 2750 mL toluene was added in order to obtain a single phase mixture (provided a 1:1.83 mixture of ethanol:toluene).

In a first reaction, 318.7 grams of hexadecylamine was added to the single phase mixture, and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes using a Rousselet Robatel® RC 20 centrifuge. The capped particles were dried in a vacuum to obtain a free flowing powder of nanocrystalline capped silver particles having about 18% hexadecylamine.

In a second reaction, 24 grams of dodecylamine was added to the single phase mixture and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes in a Rousselet Robatel® RC 20 centrifuge. The capped particles were dried in a vacuum to obtain a free flowing powder of nanocrystalline capped silver particles having about 8% dodecylamine.

Each of the capped particle samples was dispersed in toluene, and a clear absorption at 409-416 nm was observed using a Hewlett-Packard® UV-Visible Spectrophotometer (Model No.: HP8452A) and a 1 cm path length disposable cuvette. An absorbance at 409-416 nm absorption is typical of nanocrystalline silver.

EXAMPLE 2

Depending on the applications for which the metal particles are intended, different loading rates may be used. The following loading rates have been used to produce particles. In parenthesis is the liquid used to extract the metal particles from the single phase solution.

| Sample | Percent Loading (%) |
| --- | --- |
| Ag-HDA (Methanol ppt) | 18.69 |
| Ag-HDA (Acetone ppt) | 2.63 |
| Ag-DDA (Methanol ppt) | 7.35 |
| Ag-DDA (Acetone ppt) | 2.50 |

EXAMPLE 3

Capped particles were produced using the protocol described in Example 1 and with varying loading rates of hexadecylamine. Particles were produced that had 18% by weight hexadecylamine or 8% hexadecylamine. A commercial powder (70 nm in size) that was commercially available from Sigma-Aldrich and 40 nm powder (type 3) available from an industrial supplier (Nanodynamics, Inc. of Buffalo, N.Y.) were tested along with the two particle samples.

FIG. 5 shows thermo-gravimetric analysis of three different thin films produced using the three materials. Type one material was coated with 18% HDA, type 2 was coated with 8% HDA and type 3 was the commercially available powder with 2% of an organic coating. Three different silver inks were made by mixing or dispersing of one of the selected materials in toluene (about 6% solution by weight). Thin films were made on glass by spin coating the inks at similar conditions. The glass substrates with wet films were then heated at 200° C. for 100 seconds. Upon heating HDA and the solvent decomposed and evaporated to provide a surface of silver particles. Such particles easily and completely coalesced and the ink made of silver particles with 18% of HDA coating produced thin silvery and shiny films. Both of the inks made of silver nanopowder with only 8% HDA coating and made of commercially available produced dark and loose grayish films.

The conductivity of the films was measured by conventional 4-point probe meter (Lucas Labs model Pro4). The films made of 18% HDA coated nanopowder produced highly conductive films with the conductivity in the range of 30-40*$10^4$ S/cm, which was only slightly lower then the conductivity of the bulk silver (~62*$10^4$ S/cm). The films also have had very good adhesion to the glass substrate and easily passed tape and scratch tests usually used to evaluate the adhesion properties (ASTM D3359-02 dated Aug. 10, 2002).

EXAMPLE 4

Metal particles prepared according to Example 1 above may be dispersed in toluene to provide an ink. In one illustration, metal particles may be dispersed in toluene to provide 20 weight percent particles and a solution viscosity of about 1 cPs. The ink may be applied to a substrate using spin coating, for example, or may be used in spin coating applications. The particles may be silver or gold particles or other illustrative metals disclosed herein.

EXAMPLE 5

Metal particles prepared according to Example 1 above may be dispersed in IsoPar® G solvent to provide an ink. In one illustration, metal particles may be dispersed in IsoPar® G solvent to provide 20 weight percent particles and a solution viscosity of about 1 cPs. The ink may be applied to a substrate using spin coating, for example, or may be used in spin coating applications. The particles may be silver or gold particles or other illustrative metals disclosed herein.

EXAMPLE 6

Metal particles prepared according to Example 1 above may be dispersed in an organic solvent mixture to provide an ink. In one illustration, metal particles may be dispersed in toluene/Isopar® L solvent/Isopar® V solvent (1:2:8) to provide 20 weight percent particles and a solution viscosity of about 8-9 cPs. The ink may be applied to a substrate using inkjet printing devices and methods, for example, or may be used in inkjet applications. The particles may be silver or gold particles or other illustrative metals disclosed herein.

EXAMPLE 7

Metal particles prepared according to Example 1 above may be dispersed in an organic solvent mixture to provide an ink. In one illustration, metal particles may be dispersed in toluene/Isopar® V solvent (1:2) and 3 weight percent polyisobutylene (PIB) to provide 20 weight percent particles and a solution viscosity of about 8-9 cPs. The ink may be applied to a substrate using inkjet printing devices and methods, for example, or may be used in inkjet applications. The particles may be silver or gold particles or other illustrative metals disclosed herein.

EXAMPLE 8

Metal particles prepared according to Example 1 above may be dispersed in an organic solvent mixture to provide an ink. In one illustration, metal particles may be dispersed in toluene/Isopar® V solvent (1:1) to provide 80 weight percent particles. The ink may be applied to a substrate using paste printing methods, for example, or may be used in past printing applications. The particles may be silver or gold particles or other illustrative metals disclosed herein.

EXAMPLE 9

Several inks were prepared by placing capped silver particles in toluene. Each of the capped silver particles used in the inks was prepared using the protocol of Example 1 and extracted in methanol once unless otherwise noted. The various inks are shown in the table below. The silver particles in Ink B were washed in methanol twice, and the silver particles in Ink C were extracted using acetone. Inks F and G were made from commercially available silver nanoparticles. In particular, Inks F and G were made by dispersion of silver powder in toluene in the weight ratio 1:5. The ink was sonicated for 60 min prior to making the films. Ink F was made from Aldrich powder (Cat#57683-2), and Ink G was made using Nanodynamics Product Name NDSilver (Lot #31-0048).

| Ink | Capping Agent | Amount of Capping Agent (%) |
| --- | --- | --- |
| Ink A | Hexadecylamine | 18 |
| Ink B | Hexadecylamine | 12-14 |
| Ink C | Hexadecylamine | 2-3 |
| Ink D | Dodecylamine | 8 |
| Ink E | Octylamine | 5-6 |
| Ink F (Commercial Product 1) | NA | 4 |
| Ink G (Commercial Product 2) | NA | 0.5 |

Each of the inks was used in a spin coating process to form a film. To form each film, each ink was heated on a hot plate at 250° C. for 30 seconds. After heating, each ink was spin coated onto a glass substrate using a KW-4A spin coater commercially available from Chemat Technology (Northridge, Calif.). The coating procedure involved coating at 600 rpm for 9 seconds followed by coating at 1000 rpm for 30 seconds. The resulting properties of each film are shown below. Adhesion was tested by tape test according to ASTM D3359-02 dated Aug. 10, 2002. The resistivity of each film was measured using a 4-point probe (Lucas Labs).

| Ink | Film Description | Adhesion | Resistivity (μΩ × cm) |
| --- | --- | --- | --- |
| Ink A | Shiny, smooth and uniform (FIG. 6A). | Very good, passed tape test | 3-4 |
| Ink B | Shiny, uneven with pinholes (FIG. 6B) | Good | 3-4 |
| Ink C | Did not form a film | | ∞ |
| Ink D | Shiny, uneven, numerous pinholes (FIG. 6C) | Poor | 20-30 |
| Ink E | Does not form a film, crumbles on heating | | ∞ |
| Ink F | Does not form a film, grey agglomerates present Does not form a film | | ∞ |

EXAMPLE 10

A composition was prepared comprising the following materials: a sufficient amount of nanosilver capped with hexadecylamine (produced as described above in Example 1) was dispersed in a solvent system that included 1 part toluene, 4 parts terpeniol and 4 parts xylene to provide 20 weight percent nanosilver coated with hexadecylamine in the dispersion.

The surface tension and the viscosity of the dispersion were measured. Surface tension was measured using a Capillary Surface Tension Apparatus from Fisher. Viscosity was measured using a Brookfield Digital Viscometer DV-II. The surface tension was found to be 30 dynes/cm, and the viscosity was found to be 10 cPs.

EXAMPLE 11

A composition was prepared comprising the following materials: a sufficient amount of nanosilver capped with hexadecylamine (produced as described in Example 1) was dispersed in a solvent system that included 4 parts toluene, 1 part terpeniol, 4 parts xylene and 0.1 g/L ethylene glycol to provide 20 weight percent nanosilver coated with hexadecylamine in the dispersion.

The surface tension and the viscosity of the dispersion were measured as described in Example 10. The surface tension was found to be 32 dynes/cm, and the viscosity was found to be 14 cPs.

EXAMPLE 12

A composition was prepared comprising the following materials: a sufficient amount of nanosilver capped with dodecylamine (produced as described in Example 1) was dispersed in a solvent system that included 4 parts butanol and 1 part toluene to provide 20 weight percent nanosilver coated with dodecylamine in the dispersion.

The surface tension and the viscosity of the dispersion were measured as described in Example 10. The surface tension was found to be 30 dynes/cm, and the viscosity was found to be 10 cPs. Certain structures were printed using the ink of this example. The structures are shown in FIGS. 3A-3C, 4A and 4B. The structures were printed with a Dimatix DMP printer. Printing conditions were as follows: firing voltage 20 V, firing frequency 2 kHz, drop spacing 15 microns.

The resistivity of printed lines shown in FIG. 4 was about 4 μΩcm (measured using a conventional 4-point probe meter (Lucas Labs model Pro4)) and it passed a typical tape adhesion test (ASTM D3359-02 dated Aug. 10, 2002).

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. An ink, comprising:
a solvent system comprising at least one non-polar component and at least one polar component present in a ratio sufficient to provide a viscosity of about 10-12 cPs or a surface tension of about 30-32 dynes/cm to the ink at a printing temperature; and
hexadecylamine capped silver nanoparticles dispersed in the solvent system, the capped silver nanoparticles comprising at least about 18% by weight hexadecylamine.

2. The ink of claim 1 in which the at least one non-polar component has a dielectric constant that is lower than the dielectric constant of the at least one polar component.

3. The ink of claim 2 in which the at least one non-polar component comprises a hydrocarbon.

4. The ink of claim 3 in which the at least one polar component comprises an alcohol.

5. The ink of claim 2 in which the at least one polar component comprises an alcohol.

6. The ink of claim 2 further comprising at least one viscosity modifier.

7. The ink of claim 1 in which the solvent system provides a viscosity of about 10-12 cPs and a surface tension of about 30-32 dynes/cm to the ink at the printing temperature.

8. The ink of claim 1, wherein the at least one non-polar component comprises at least one of xylene and mesitylene.

9. The ink of claim 1, wherein the at least one polar component comprises terpeniol.

10. The ink of claim 1, wherein the ratio of the at least one non-polar component to the at least one polar component is in a range of about 4:1 to about 1:4.

11. The ink of claim 1, wherein the solvent system includes three or more solvents.

12. The ink of claim 11, wherein the solvent system comprises toluene, terpeniol and xylene.

13. The ink of claim 12, wherein the solvent system comprises four parts toluene, one part terpeniol, and four parts xylene.

14. The ink of claim 1, wherein the solvent system comprises butanol and toluene.

15. The ink of claim 14, wherein the solvent system comprises four parts butanol and one part toluene.

16. The ink of claim 1, wherein the ink comprises about 20-25% by weight hexadecylamine capped silver nanoparticles in the dispersion.

17. An ink, comprising:
a solvent system comprising at least one non-polar component and at least one polar component present in a ratio of about 4:1, 3:1, 2:1, 1:2, 1:3 or 1:4; and
capped silver nanoparticles dispersed in the solvent system, the capped silver nanoparticles comprising silver nanoparticles capped with hexadecylamine or silver nanoparticles capped with dodecylamine.

18. The ink of claim 17 in which the at least one non-polar component has a dielectric constant that is lower than the dielectric constant of the at least one polar component.

19. The ink of claim 18 in which the at least one non-polar component comprises a hydrocarbon.

20. The ink of claim 19 in which the at least one polar component comprises an alcohol.

21. The ink of claim 18 in which the at least one polar component comprises an alcohol.

22. The ink of claim 18 further comprising at least one viscosity modifier.

23. The ink of claim 17 in which the solvent system provides a viscosity of about 10-12 cPs or a surface tension of about 30-32 dynes/cm to the ink at the printing temperature.

24. The ink of claim 17, wherein the at least one non-polar component comprises at least one of xylene and mesitylene.

25. The ink of claim 17, wherein the at least one polar component comprises terpeniol.

26. A printing system, comprising:
a print head;
an ink reservoir fluidically coupled to the print head and comprising an ink, the ink comprising:
a solvent system comprising at least one non-polar component and at least one polar component present in a ratio sufficient to provide a viscosity of about 10-12 cPs or a surface tension of about 30-32 dynes/cm to the ink at a printing temperature; and hexadecylamine capped silver nanoparticles dispersed in the solvent system, the capped silver nanoparticles comprising at least about 18% by weight hexadecylamine; and
means for moving the print head.

* * * * *